United States Patent
Igarashi et al.

(10) Patent No.: US 7,982,391 B2
(45) Date of Patent: Jul. 19, 2011

(54) ORGANIC ELECTROLUMINESCENT DEVICE

(75) Inventors: Tatsuya Igarashi, Kanagawa (JP); Toshihiro Ise, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 603 days.

(21) Appl. No.: 11/019,297

(22) Filed: Dec. 23, 2004

(65) Prior Publication Data

US 2005/0142383 A1 Jun. 30, 2005

(30) Foreign Application Priority Data

Dec. 26, 2003 (JP) ................. 2003-434072

(51) Int. Cl.
*H01L 51/54* (2006.01)
*C09K 11/06* (2006.01)

(52) U.S. Cl. ........ 313/504; 313/506; 428/690; 428/917; 257/40; 257/E51.044; 257/E51.047

(58) Field of Classification Search .................. None
See application file for complete search history.

(56) References Cited

U.S. PATENT DOCUMENTS

| | | | | |
|---|---|---|---|---|
| 6,020,078 | A * | 2/2000 | Chen et al. ............ | 428/690 |
| 6,310,360 | B1 * | 10/2001 | Forrest et al. .......... | 257/40 |
| 2001/0016269 | A1 * | 8/2001 | Otani et al. ........... | 428/690 |
| 2001/0043044 | A1 * | 11/2001 | Wakimoto et al. ..... | 313/506 |
| 2002/0146589 | A1 * | 10/2002 | Akiyama et al. ....... | 428/690 |
| 2003/0082406 | A1 * | 5/2003 | Murase et al. ......... | 428/690 |
| 2003/0218418 | A9 * | 11/2003 | Sato et al. ............. | 313/504 |

FOREIGN PATENT DOCUMENTS

| WO | WO 00/70655 A2 | 11/2000 |
|---|---|---|
| WO | WO 01/08230 A1 | 2/2001 |

OTHER PUBLICATIONS

Chen et al., Applied Physics Letters, (2001), vol. 79, No. 22, pp. 3711-3713.*
Baldo et al., Nature, (2000), vol. 403, pp. 750-753.*
Tang et al., Journal of Applied Physics, (1989), vol. 85, No. 9, pp. 3610-3616.*

* cited by examiner

*Primary Examiner* — D. Lawrence Tarazano
*Assistant Examiner* — Brett A Crouse
(74) *Attorney, Agent, or Firm* — Sughrue Mion, PLLC

(57) ABSTRACT

An organic electroluminescent device comprising two electrodes and at least one organic compound layer disposed between the electrodes,
wherein a luminescent layer is included in the organic compound layers, the luminescent layer includes a fluorescent compound, at least one of the organic compound layers comprises an amplifying agent, the fluorescent compound emits fluorescent light upon application of voltage, the amplifying agent is capable of amplifying a number of singlet excitons and of amplifying luminescence intensity, and an amount of the amplifying agent is such an amount that at least 51% of light components emitted by the device upon the application of voltage is fluorescent light,
wherein the fluorescent compound is selected from the group consisting of a distyryl arylene derivative, an oligoarylene derivative, an nitrogen-containing aromatic heterocyclic compound, a sulfur-containing heterocyclic compound, a metal complex, an oxo-substituted heterocyclic compound, an organosilicon compound and a triaryl amine derivative.

13 Claims, No Drawings

ORGANIC ELECTROLUMINESCENT DEVICE

CROSS-REFERENCE TO RELATED APPLICATION

This application claims priority under 35 USC 119 from Japanese patent Application No. 2003-434072, the disclosure of which is incorporated by reference herein.

BACKGROUND OF THE INVENTION

1. Field of the Invention

The present invention relates to a luminescent device which can emit light by converting electric energy into light, and in particular to an organic electroluminescent device.

2. Description of the Related Art

Organic electroluminescent devices (hereinafter sometimes referred to as organic EL devices or simply as luminescent devices) can give light of high luminance at low voltage, and are thus noteworthy as a promising display device. The external quantum efficiency is an important property value of this organic electroluminescent device. The external quantum efficiency is calculated according to the equation below, and the device is considered to be more advantageous with regard to energy consumption if the value is larger, that is, if more photons are released per electron injected into the device.

External quantum efficiency $\phi$=number of photons released from the device/number of electrons injected into the device.

The external quantum efficiency of the organic electroluminescent device is determined specifically according to the following equation:

External quantum efficiency $\phi$=internal quantum efficiency×light extraction efficiency.

In organic EL devices utilizing fluorescent emission from organic compounds, the upper limit of internal quantum efficiency is 25%. Since the light extraction efficiency is about 20%, the upper limit of external quantum efficiency is estimated to be about 5%.

For improving the external quantum efficiency of an organic electroluminescent device by improving the internal quantum efficiency of the device, a device using a triplet luminescent material (phosphorescent material) has been reported (see, for example, International publication No. WO 2000/070655). This device can achieve a higher external quantum efficiency than a conventional device (singlet luminescent device) utilizing florescent emission, and can realize a maximum external quantum efficiency of 8% (an external quantum efficiency at 100 cd/m$^2$ is 7.5%). However, since phosphorescent emission from a heavy atom metal complex is used in the device using a phosphorescent material, the emission response is slow, and there are also needs for improvement in durability.

In order to solve this problem, a singlet luminescent device using energy transfer from triplet exciton to singlet exciton has been reported (see, for example, WO 2001-008230). However, the maximum external quantum efficiency of the device described in this reference is as low as 3.3%, and does not exceed the external quantum efficiency ($\phi$=5%) of the conventional singlet luminescent device. Therefore, there are needs for further improvement in efficiency.

SUMMARY OF THE INVENTION

The present invention has been made considering the above problems concerning the prior art.

A first aspect of the invention is to provide an organic electroluminescent element comprising at least one organic compound layer between a pair of electrodes and containing a compound (hereinafter occasionally referred to as "fluorecent compound") which emits fluorescent light upon application of voltage and a compound (hereinafter occasionally referred to as "amplifying agent") having a function of amplifying the number of singlet excitons formed upon application of voltage thereby amplifying luminescence intensity upon application of voltage, light emitted upon application of voltage being derived mainly from the fluorescent light emitted from the fluorescent emitting compound, wherein the organic compound layers include a luminescent layer and the fluorescent compound which emit light upon application of voltage is at least one selected from the group consisting of a distyryl arylene derivative, an oligoarylene derivative, an aromatic nitrogen-containing heterocyclic compound, a sulfur-containing heterocyclic compound, a metal complex, an oxo-substituted heterocyclic compound, an organosilicon compound and a triaryl amine derivative.

The above fluorecent compounds are occasionally collectively referred to as "specific fluorescent compounds" hereinafter.

A second aspect of the invention is to provide an organic electroluminescent element comprising at least one organic compound layer between a pair of electrodes and containing at least two compounds which emit fluorescent light upon application of voltage and a compound having a function of amplifying the number of singlet excitons formed upon application of voltage thereby amplifying luminescence intensity upon application of voltage, wherein the fluorescent light upon application of voltage is derived mainly from the fluorescent light emitted from the fluorecent emitting compound and the organic compound layers include a luminescent layer.

A third aspect of the invention is to provide an organic electroluminescent device comprising two electrodes and at least one organic compound layer disposed between the electrodes, wherein a luminescent layer is included in the organic compound layers, the luminescent layer includes at least two fluorescent compounds, at least one of the organic compound layers comprises an amplifying agent, the fluorescent compounds emit fluorescent light upon application of voltage, the amplifying agent is capable of amplifying a number of singlet excitons formed upon the application of voltage and of amplifying luminescence intensity upon the application of voltage, and an amount of the amplifying agent is such an amount that at least 51% of light components emitted by the device upon the application of voltage is fluorescent light, wherein at least one of the fluorescent compounds is selected from the group consisting of a distyryl arylene derivative, an oligoarylene derivative, an nitrogen-containing aromatic heterocyclic compound, a sulfur-containing heterocyclic compound, a metal complex, an oxo-substituted heterocyclic compound, an organosilicon compound and a triaryl amine derivative.

The organic electroluminescent device of the invention can emit light of high luminance and are highly durable. The device can emit lights of various colors such as blue, green and white.

DETAILED DESCRIPTION OF THE INVENTION

An embodiment of the invention is an organic electroluminescent device comprising two electrodes and at least one organic compound layer disposed between the electrodes, wherein a luminescent layer is included in the organic compound layers, the luminescent layer includes at least two fluorescent compounds, at least one of the organic compound layers comprises an amplifying agent, the fluorescent compounds emit fluorescent light upon application of voltage, the amplifying agent is capable of amplifying a number of singlet excitons formed upon the application of voltage and of amplifying luminescence intensity upon the application of voltage, and an amount of the amplifying agent is such an amount that at least 51% of light components emitted by the device upon the application of voltage is fluorescent light.

Another embodiment of the invention is an organic electroluminescent device comprising two electrodes and at least one organic compound layer disposed between the electrodes, wherein a luminescent layer is included in the organic compound layers, the luminescent layer includes a fluorescent compound, at least one of the at least one organic compound layer comprises an amplifying agent, the fluorescent compound emits fluorescent light upon application of voltage, the amplifying agent is capable of amplifying a number of singlet excitons formed upon the application of voltage and of amplifying luminescence intensity upon the application of voltage, and an amount of the amplifying agent is such an amount that at least 51% of light components emitted by the device upon the application of voltage is fluorescent light, wherein the fluorescent compound is selected from the group consisting of a distyryl arylene derivative, an oligoarylene derivative, an nitrogen-containing aromatic heterocyclic compound, a sulfur-containing heterocyclic compound, a metal complex, an oxo-substituted heterocyclic compound, an organosilicon compound and a triaryl amine derivative.

The organic electroluminescent device may further comprise another fluorescent compound. A concentration of the fluorescent compound in the luminescent layer may be 0.1% to 10% by weight. A fluorescence quantum yield of the fluorescent compound may be 70% or higher. An emission spectrum of the amplifying agent may overlap an absorption spectrum of the fluorescent compound. A phosphorescence quantum yield of the amplifying agent may be 50% or higher. A phosphorescence life of the amplifying agent may be 10 μs or shorter.

One of the at least one organic compound layer may contact an anode-side surface of the luminescent layer, and the organic compound layer may have a lowest excited triplet state energy of 209.2 kJ/mol to 377.1 kJ/mol. One of the at least one organic compound layer may contact a cathode-side surface of the luminescent layer, and the organic compound layer may have a lowest excited triplet state energy of 209.2 kJ/mol to 377.1 kJ/mol. The device may emit white light. The term, "the white light emission", used herein refers to emission of a light having x value of 0.25 to 0.40 and y value of 0.25 to 0.40 on the CIE chromaticity diagram.

The present invention relates to an organic electroluminescent device. The device comprises at least one organic compound layer between two electrodes. The device comprises a luminescent layer as one of the organic compound layer(s). The device comprises a fluorescent compound and an amplifying agent. When a voltage is applied to the device, the device emits light which is derived mainly from light emitted by the fluorescent compound. At least one compound selected from the group consisting of (A) distyryl arylene derivatives, (B) oligoarylene derivatives, (C) aromatic nitrogen-containing heterocyclic compounds, (D) sulfur-containing heterocyclic compounds, (E) metal complexes, (F) oxo-substituted heterocyclic compounds, (G) organosilicon compounds and (H) triaryl amine derivatives is used as the fluorescent compound.

In a preferable embodiment, at least two compounds are included in the device as the fluorescent compound.

In the invention, the ratio between the fluorescent light component and the phosphorescent light component is calculated from the emission intensity of the fluorescent light at the emission peak wavelength of the fluorescent light and the emission intensity of the phosphorescent light at the emission peak wavelength of the phosphorescent light. In the organic electroluminescent device of the invention, the light emitted upon application of voltage is derived mainly from light emitted by the fluorescent compound. In other words, 51% or more of the emission components obtained from the device are luminescence (fluorescence) from singlet excitons, and the remainder (49% or less) are luminescence (phosphorescence) from triplet excitons. In the invention, it is a preferable embodiment that 70% or more of the emission components obtained from the device are fluorescence and 30% or less of the emission components are phosphorescence. It is a more preferable embodiment that 80% or more of the emission components obtained from the device are fluorescence and 20% or less of the emission components are phosphorescence. It is most preferable that 90% or more of the emission components obtained from the device are fluorescence and 10% or less of the emission components are phosphorescence. It is preferable that the luminescence is mainly derived from fluorescence, because the response and durability of luminescence are higher than in a case where phosphorescence is the main component, and decrease in efficiency at the time of high luminance (for example 1000 cd/m$^2$ or higher) is smaller than in a case where phosphorescence is the main component.

The amplifying agent, which is used in the organic electroluminescent device of the invention, has a function of amplifying the number of singlet excitons formed upon application of voltage thereby amplifying the luminescence intensity of the fluorescent light emitted by the fluorescent compound upon application of voltage. The phosphorescent emission peak of the amplifying agent is preferably 380 nm to 650 nm, more preferably 400 nm to 630 nm, still more preferably 410 nm to 620 nm, further more preferably 420 nm to 610 nm.

Phosphorescence of the amplifying agent may be determined, for example by: freeze-degassing a solution containing the amplifying agent (for example 1×10$^{-5}$ mol/l solution in toluene), exciting the amplifying agent with a light of its absorption peak at 20° C., and measuring the phosphorescence.

The phosphorescence quantum yield of the amplifying agent used in the invention is preferably 20% or higher, more preferably 40% or higher, still more preferably 60% or higher. The phosphorescence quantum yield of the amplifying agent can be measured at 20° C. after freeze-degassing a solution containing the amplifying agent (for example 1×10$^{-5}$ mol/l solution in toluene).

The emission peak of the fluorescent compound used in the invention is preferably 350 nm to 680 nm, more preferably 410 nm to 670 nm, still more preferably 420 nm to 660 nm, further more preferably 430 nm to 650 nm.

The organic EL device of the invention preferably comprises at least one host material in the luminescent layers. The host material may be contained in the fluorescent-compound-containing layer, which is one of the luminescent layers, or may be contained in the amplifying-agent-containing layer.

The host material is contained preferably in both the fluorescent-compound-containing layer and the amplifying-agent-containing layer.

The $T_1$ level (energy level of the minimum excited triplet state) of the host material used in the luminescent device of the invention is preferably 50 kcal/mol (209.2 kJ/mol) to 90 kcal/mol (377.1 kJ/mol), more preferably 52 kcal/mol (217.6 kJ/mol) to 80 kcal/mol (335.2 kJ/mol), still more preferably 55 kcal/mol (230.1 kJ/mol) to 70 kcal/mol (293.3 kJ/mol).

The $T_1$ level (energy level of the lowest excited triplet state) of the layer (for example, an electron transport layer, a hole block layer, or an exciton block layer) contacting the cathode-side surface of the luminescent layer in the luminescent device of the invention is preferably 50 kcal/mol (209.2 kJ/mol) to 90 kcal/mol (377.1 kJ/mol), more preferably 52 kcal/mol (217.6 kJ/mol) to 80 kcal/mol (335.2 kJ/mol), still more preferably 55 kcal/mol (230.1 kJ/mol) to 70 kcal/mol (293.3 kJ/mol).

The $T_1$ level (energy level of the lowest excited triplet state) of the layer (for example, a hole transport layer) contacting the anode-side surface of the luminescent layer is preferably 50 kcal/mol (209.2 kJ/mol) to 90 kcal/mol (377.1 kJ/mol), more preferably 52 kcal/mol (217.6 kJ/mol) to 80 kcal/mol (335.2 kJ/mol), still more preferably 55 kcal/mol (230.1 kJ/mol) to 70 kcal/mol (293.3 kJ/mol).

The organic electroluminescent device of the invention preferably comprises a fluorescent compound selected from the group consisting of (A) a distyryl arylene derivative, (B) an oligoarylene derivative, (C) an aromatic nitrogen-containing heterocyclic compound, (D) a sulfur-containing heterocyclic compound, (E) a metal complex, (F) an oxo-substituted heterocyclic compound, (G) an organosilicon compound and (H) a triaryl amine derivative. As recited above, these compounds are occasionally referred to as "specific fluorescent compounds" herein. Hereinafter, the specific fluorescent compounds used preferably in the invention are described in more detail.

First, the distyryl arylene derivative (A) which can be used in the invention is described. The distyryl arylene derivative refers to a compound having two or more styryl groups bound to each other via arylene linking groups.

The structure of the arylene linking groups in the distyryl arylene derivative (A) is not particularly limited, and preferable examples thereof include a phenylene group, a naphthylene group, an anthrylene group, a pyrenylene group, a perylenylene group, and a linking group (for example, a biphenylene group, a terphenylene group, a tetraphenylene group, a diphenyl anthracene group etc.) consisting of a combination of the above groups, among which a phenylene group, a naphthylene group, an anthrylene group and a linking group consisting of a combination of the above groups are preferable. A compound obtained by connecting two to four groups selected from the group consisting of phenylene groups, naphthylene groups and anthrylene groups is more preferable.

The styryl group or the arylene linking group may further have a substituent. The substituent may be, for example: an alkyl group (preferably having 1 to 30 carbon atoms, more preferably having 1 to 20 carbon atoms, particularly preferably having 1 to 10 carbon atoms, such as methyl, ethyl, iso-propyl, tert-butyl, n-octyl, n-decyl, n-hexadecyl, cyclopropyl, cyclopentyl, or cyclohexyl); an alkenyl group (preferably having 2 to 30 carbon atoms, more preferably having 2 to 20 carbon atoms, particularly preferably having 2 to 10 carbon atoms, such as vinyl, allyl, 2-butenyl, or 3-pentenyl); an alkynyl group (preferably having 2 to 30 carbon atoms, more preferably having 2 to 20 carbon atoms, particularly preferably having 2 to 10 carbon atoms, such as propargyl or 3-pentynyl); an aryl group (preferably having 6 to 30 carbon atoms, more preferably having 6 to 20 carbon atoms, particularly preferably having 6 to 12 carbon atoms, such as phenyl, p-methylphenyl, naphthyl, or anthranyl); an amino group (whose carbon number is preferably 0 to 30, more preferably 0 to 20, particularly preferably 0 to 10, such as amino, methylamino, dimethylamino, diethylamino, dibenzylamino, diphenylamino, or ditolylamino); an alkoxy group (preferably having 1 to 30 carbon atoms, more preferably having 1 to 20 carbon atoms, particularly preferably having 1 to 10 carbon atoms, such as methoxy, ethoxy, butoxy, or 2-ethylhexyloxy); an aryloxy group (preferably having 6 to 30 carbon atoms, more preferably having 6 to 20 carbon atoms, particularly preferably having 6 to 12 carbon atoms, such as phenyloxy, 1-naphthyloxy, or 2-naphthyloxy); a heterocyclic oxy group (preferably having 1 to 30 carbon atoms, more preferably having 1 to 20 carbon atoms, particularly preferably having 1 to 12 carbon atoms, such as pyridyloxy, pyrazyloxy, pyrimidyloxy, or quinolyloxy); an acyl group (preferably having 1 to 30 carbon atoms, more preferably having 1 to 20 carbon atoms, particularly preferably having 1 to 12 carbon atoms, such as acetyl, benzoyl, formyl, or pivaloyl); an alkoxycarbonyl group (preferably having 2 to 30 carbon atoms, more preferably having 2 to 20 carbon atoms, particularly preferably having 2 to 12 carbon atoms, such as methoxycarbonyl or ethoxycarbonyl); an aryloxycarbonyl group (preferably having 7 to 30 carbon atoms, more preferably 7 to 20 carbon atoms, particularly preferably having 7 to 12 carbon atoms such as phenyloxycarbonyl); an acyloxy group (preferably having 2 to 30 carbon atoms, more preferably having 2 to 20 carbon atoms, particularly preferably having 2 to 10 carbon atoms, such as acetoxy or benzoyloxy); an acylamino group (preferably having 2 to 30 carbon atoms, more preferably having 2 to 20 carbon atoms, particularly preferably having 2 to 10 carbon atoms, such as acetylamino or benzoylamino); an alkoxycarbonylamino group (preferably having 2 to 30 carbon atoms, more preferably having 2 to 20 carbon atoms, particularly preferably having 2 to 12 carbon atoms, such as methoxycarbonylamino); an aryloxycarbonylamino group (preferably having 7 to 30 carbon atoms, more preferably having 7 to 20 carbon atoms, particularly preferably having 7 to 12 carbon atoms, such as phenyloxycarbonylamino); a sulfonylamino group (preferably having 1 to 30 carbon atoms, more preferably having 1 to 20 carbon atoms, particularly preferably having 1 to 12 carbon atoms, such as methanesulfonylamino or benzenesulfonylamino); a sulfamoyl group (whose carbon number is preferably 0 to 30, more preferably 0 to 20, particularly preferably 0 to 12, such as sulfamoyl, methylsulfamoyl, dimethylsulfamoyl, or phenylsulfamoyl); a carbamoyl group (preferably having 1 to 30 carbon atoms, more preferably having 1 to 20 carbon atoms, particularly preferably having 1 to 12 carbon atoms, such as carbamoyl, methylcarbamoyl, diethylcarbamoyl, or phenylcarbamoyl); an alkylthio group (preferably having 1 to 30 carbon atoms, more preferably having 1 to 20 carbon atoms, particularly preferably 1 to 12 carbon atoms, such as methylthio or ethylthio); an arylthio group (preferably having 6 to 30 carbon atoms, more preferably 6 to 20 carbon atoms, particularly preferably 6 to 12 carbon atoms, such as phenylthio); a heterocyclic thio group (preferably having 1 to 30 carbon atoms, more preferably having 1 to 20 carbon atoms, particularly preferably having 1 to 12 carbon atoms, such as pyridylthio, 2-benzimizolylthio, 2-benzoxazolylthio, or 2-benzthiazolylthio); a sulfonyl group (preferably having 1 to 30 carbon atoms, more preferably having 1 to 20 carbon atoms, particularly preferably having 1 to 12 carbon atoms, such as mesyl or tosyl); a sulfinyl group (preferably having 1 to 30 carbon atoms, more preferably having 1 to 20 carbon atoms, particularly preferably having 1 to 12 carbon atoms, such as methanesulfinyl or benzenesulfinyl); an ureido group (preferably having 1 to 30 carbon atoms, more preferably having 1 to 20 carbon atoms, particularly preferably having 1 to 12 carbon atoms, such as ureido, methylureido, or phenylureido); a phosphoric amide group (preferably having 1 to 30 carbon atoms, more preferably having 1 to 20 carbon atoms, particularly preferably having 1 to 12 carbon atoms, such as diethylphosphoric amide or phenylphosphoric amide); a hydroxy group; a mercapto group; a halogen atom (such as a fluorine atom, a chlorine atom, a bromine atom, or an iodine atom); a cyano group; a sulfo group; a carboxyl group; a nitro group; a hydroxamic acid group; a sulfino group; a hydrazino group; an imino group; a heterocyclic group (preferably having 1 to 30 carbon atoms, more preferably having 1 to 12 carbon atoms, the heteroatom being, for example, a nitrogen atom, an oxygen atom or a sulfur atom, specific examples of the heterocyclic group being imidazolyl, pyridyl, quinolyl, furyl, thienyl, piperidyl, morpholino, benzoxazolyl, benzimidazolyl, benzthiazolyl, carbazolyl, or azepinyl); a silyl group (preferably having 3 to 40 carbon atoms, more preferably having 3 to 30 carbon atoms, particularly preferably having 3 to 24 carbon atoms, such as trimethylsilyl or triphenylsilyl); or a silyloxy group (preferably having 3 to 40 carbon atoms, more preferably having 3 to 30 carbon atoms, particularly preferably having 3 to 24 carbon atoms, such as trimethylsilyloxy or triphenylsilyloxy). These substituents each may further have a substituent.

The substituent on the styryl group is preferably an alkyl group, an aryl group, a heteroaryl group, a vinyl group, or a group that can combine with another substituent on the styryl group to form a ring structure (a hydrocarbon ring, a heterocycle etc., for example, a benzene ring or a pyrrole ring). The substituent on the styryl group is more preferably an alkyl group, an aryl group or a group that can combine with another substituent on the styryl group to form a ring structure.

The substituent on the aryl linking group is preferably an alkyl group, an aryl group, a heteroaryl group, a vinyl group, or a group that can combine with another substituent on the aryl linking group to form a ring structure (a hydrocarbon ring, a heterocycle etc., for example, a benzene ring or a pyrrole ring). The substituent on the aryl linking group is more preferably an alkyl group or an aryl group.

The distyryl arylene derivative used in the invention is preferably a compound represented by the formula (1).

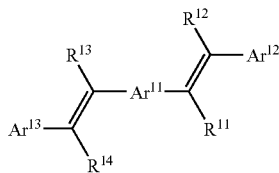

Formula (1)

Hereinafter, the formula (1) is explained in detail. In the formula (1), $Ar^{11}$ represents an arylene group. Examples of the arylene group include a phenylene group, a naphthylene group, an anthrylene group, a pyrenylene group, a perylenylene group and a linking group consisting of a combination of the above groups (for example, a biphenylene group, a terphenylene group, a tetraphenylene group, or a diphenyl anthracene group), among which a phenylene group, a naphthylene group, an anthrylene group and a linking group consisting of a combination of the above groups are preferable, and a compound obtained by combining two to four groups selected from the group consisting of phenylene groups, naphthylene groups, and anthrylene groups is more preferable.

$Ar^{12}$ and $Ar^{13}$ each independently represent an aryl group. Examples of the aryl group include a phenyl group, a naphthyl group, an anthryl group, a phenanthryl group, a pyrenyl group, a perylenyl group and a triphenylenyl group. The aryl group may have substituents thereon, and the substituents may be bound to each other to form a ring structure (a hydrocarbon ring or a heterocycle, for example, a benzene ring, or a pyrrole ring). The substituents may be selected from the above-described substituents listed as examples of the substituent on the styryl group. $Ar^{12}$ and $A^{13}$ is preferably an aryl group.

$R^{11}$, $R^{12}$, $R^{13}$ and $R^{14}$ each independently represent a hydrogen atom or a substituent. $R^{11}$, $R^{12}$, $R^{13}$ and $R^{14}$ each are preferably a hydrogen atom, an alkyl group, an aryl group or a heteroaryl group, more preferably a hydrogen atom or an aryl group.

In the following, the aromatic nitrogen-containing heterocyclic compound (B) used in the invention is described. The aromatic nitrogen-containing heterocyclic derivative is preferably a compound which is not a complex (a boron complex, a metal complex).

The nitrogen-containing heterocycle in the aromatic nitrogen-containing heterocyclic compound is not particularly limited, and examples thereof include a pyrrole ring, a pyrazole ring, an imidazole ring, a triazole ring, an oxazole ring, a thiazole ring, a pyridine ring, a pyrimidine ring, a pyrazine ring, a pyridazine ring, a triazine ring and a condensed ring thereof (for example, a benzimidazole ring, a benzoxazole ring, a quinoline ring, a quinoxaline ring, a carbazole ring, or an imidazopyridine ring). These heterocycles may have substituents thereon. Examples of the substituents include the above-described groups listed as examples of the substituent on the styryl group.

The aromatic nitrogen-containing heterocyclic compound is preferably a pyrrole derivative, an imidazole derivative, an oxazole derivative or a thiazole ring derivative, more preferably a carbazole derivative or a benzothiazole derivative.

The nitrogen-containing heterocyclic compounds used in the invention are preferably compounds represented by the following formulae (2) and (3).

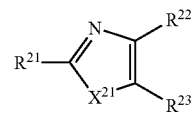

Formula (2)

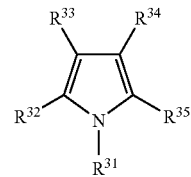

Formula (3)

In the following, the formula (2) is explained. $R^{21}$, $R^{22}$ and $R^{23}$ each independently represent a hydrogen atom or a substituent. The substituent may be selected from the above-described substituents listed as examples of the substituent on the styryl group. $R^{22}$ and $R^{23}$ may be bonded to each other to form a ring structure (for example a benzo condensed ring).

$R^{21}$ is preferably an alkyl group, an aryl group or a heterocyclic group, more preferably an aryl group or a heterocyclic group. Each of $R^{22}$ and $R^{23}$ is preferably an alkyl group, an aryl group, a heteroaryl group, or a group which is capable of combining with the other one of $R^{22}$ and $R^{23}$ to form a ring structure, more preferably an aryl group, a heteroaryl group or a group which is capable of combining with the other one of $R^{22}$ and $R^{23}$ to form a ring structure, still more preferably a group which is capable of combining with the other one of $R^{22}$ and $R^{23}$ to form a ring structure, still more preferably a group which is capable of combining with the other one of $R^{22}$ and $R^{23}$ to form an aromatic ring.

$X^{21}$ represents an oxygen atom, a sulfur atom or a substituted or unsubstituted nitrogen atom, and is preferably an oxygen atom or a sulfur atom, more preferably a sulfur atom.

In the following, the formula (3) is explained. $R^{31}$, $R^{32}$, $R^{33}$, $R^{34}$ and $R^{35}$ each independently represent a hydrogen atom or a substituent. The substituent may be selected from the above-described substituents listed as examples of the substituent on the styryl group. $R^{32}$ and $R^{33}$ may be bonded to each other to form a ring structure (for example a benzo condensed ring). $R^{34}$ and $R^{35}$ may be bonded to each other to form a ring structure (for example a benzo condensed ring).

$R^{31}$ is preferably an alkyl group, an aryl group or a heteroaryl group, more preferably an aryl group or an alkyl group, still more preferably an alkyl group.

Each of $R^{32}$, $R^{33}$, $R^{34}$ and $R^{35}$ is preferably an alkyl group, an aryl group, a heteroaryl group, or a group which is capable of combining with one selected from the other substituents to form a ring structure, more preferably an aryl group or a group which is capable of combining with one selected from the other substituents to form a ring structure, still more preferably a group which is capable of combining with one selected from the other substituents to form a ring structure, still more preferably a group which is capable of combining with one selected from the other substituents to form an aromatic ring.

The oligoarylene derivative (C) used in the invention is described. The oligoarylene derivative refers to a compound comprising two or more aryl groups linked therein. The number of aryl groups linked in the oligoarylene derivative (C) is preferably 2 to 8, more preferably 2 to 6, still more preferably 3 or 4.

Examples of the aryl group include, but are not limited to, a phenyl group, a naphthyl group, an anthryl group, a pyrenyl group, a perylenyl group and a triphenylenyl group. The aryl group may have a substituent thereon, and the substituent may be selected from the above-described substituents listed as examples of the substituent on the styryl group.

The oligoarylene derivative is preferably a biphenylene derivative, a terphenylene derivative, a tetraphenylene derivative, a diphenyl anthracene derivative, a binaphthylene derivative, a bianthrylene derivative or a teranthrylene derivative.

The oligoarylene derivative (C) used in the invention is preferably a compound represented by the formula (6).

$$Ar^{61}\text{-}Ar^{62} \quad \text{Formula (6)}$$

In the following, the formula (6) is explained.

$Ar^{61}$ and $Ar^{62}$ each independently represent an aryl group. The aryl group is preferably a phenyl group, a naphthyl group, a pyrenyl group, an anthryl group, a perylenyl group or a triphenylenyl group, more preferably a phenyl group, a naphthyl group, a pyrenyl group, an anthryl group or a perylenyl group, still more preferably a phenyl group, a naphthyl group, a pyrenyl group or a perylenyl group. At least one of $Ar^{61}$ and $Ar^{62}$ is preferably an aryl group including 3 or more cycles, more preferably an aryl group including 4 or more cycles.

The sulfur-containing heterocyclic compound (D) usable in the invention refers to a heterocyclic compound including a sulfur atom. The sulfur-containing heterocyclic derivative is preferably a 5- or 6-membered sulfur-containing heterocyclic derivative, more preferably a thiophene derivative.

The metal complex (E) used in the invention is described. The metal ion in the metal complex is not particularly limited, but is preferably a beryllium ion, a magnesium ion, an aluminum ion, a zinc ion or a gallium ion, more preferably an aluminum ion, a zinc ion or a gallium ion, more preferably an aluminum ion.

The ligand in the metal complex is not particularly limited, but is preferably a bidentate ligand, more preferably a bidentate ligand coordinating via an oxygen atom and a nitrogen atom, a bidentate ligand coordinating via two oxygen atoms, or a bidentate ligand coordinating via two nitrogen atoms, still more preferably a bidentate ligand coordinating via an oxygen atom and a nitrogen atom or a bidentate ligand coordinating via two nitrogen atoms, further more preferably a bidentate ligand coordinating via an oxygen atom and a nitrogen atom.

The oxo-substituted heterocyclic compound (F) used in the invention is described. The oxo-substituted heterocyclic compound refers to a compound comprising a heterocycle including a carbonyl group therein. The oxo-substituted heterocyclic compound is preferably a pyrone (pyranone) derivative or a pyridone derivative.

The oxo-substituted heterocyclic compound (F) used in the invention is preferably a compound represented by the formula (4), (7), or (8).

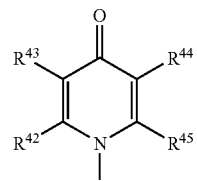

Formula (4)

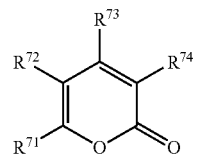

Formula (7)

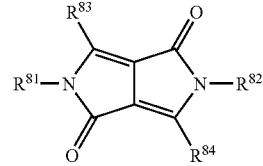

Formula (8)

In the following, the formula (4) is explained. $R^{41}$, $R^{42}$, $R^{43}$, $R^{44}$ and $R^{45}$ each independently represent a hydrogen atom or a substituent. The substituent may be selected from the above-described substituents listed as examples of the substituent on the styryl group. $R^{42}$ and $R^{43}$ may be bonded to each other to form a ring structure (for example a benzo condensed ring). $R^{44}$ and $R^{45}$ may be bonded to each other to form a ring structure (for example a benzo condensed ring).

$R^{41}$ is preferably an alkyl group, an aryl group or a heteroaryl group, more preferably an aryl group or an alkyl group, still more preferably an alkyl group.

Each of $R^{42}$, $R^{43}$, $R^{44}$ and $R^{45}$ is preferably an alkyl group, an aryl group, a heteroaryl group, or a group which is capable of combining with one selected from the other substituents to form a ring structure, more preferably an aryl group or a group which is capable of combining with one selected from the other substituents to form a ring structure, still more preferably a group which is capable of combining with one selected from the other substituents to form a ring structure, still more preferably a group which is capable of combining with one selected from the other substituents to form an aromatic ring.

In the following, the formula (7) representing a preferable embodiment of the oxo-substituted heterocyclic compound (F) is explained. $R^{71}$, $R^{72}$, $R^{73}$ and $R^{74}$ each independently represent a hydrogen atom or a substituent. The substituents may be bonded to each other to form a ring structure (for example a benzo condensed ring). The substituents may be selected from the above-described substituents listed as examples of the substituent on the styryl group.

Each of $R^{71}$ and $R^{72}$ is preferably an alkyl group, an aryl group, a heteroaryl group, or a group which is capable of combining with one selected from the other substituents to form a ring structure, more preferably a group which is capable of combining with one selected from the other substituents to form a ring structure, further more preferably a group which is capable of combining with one selected from the other substituents to form an aromatic ring, still further more preferably a group which is capable of combining with one selected from the other substituents to form an aromatic hydrocarbon ring. The substituent on the aromatic hydrocarbon ring is preferably a hydroxyl group, an alkoxy group or a substituted amino group (more preferably a dialkyl amino group).

$R^{73}$ is preferably an alkyl group, an aryl group or a heteroaryl group, more preferably an alkyl group or an aryl group, still more preferably an alkyl group.

$R^{74}$ is preferably a cyano group, a heterocyclic group, an ester group or an aryl group, more preferably a heterocyclic group, still more preferably a heteroaryl group, further more preferably a nitrogen-containing 5-membered heteroaryl group.

In the following, the formula (8) is explained. $R^{81}$, $R^{82}$, $R^{83}$ and $R^{84}$ each independently represent a hydrogen atom or a substituent. The substituent may be selected from the above-described substituents listed as examples of the substituent on the styryl group.

Each of $R^{81}$ and $R^{82}$ is preferably an alkyl group, an aryl group or a heteroaryl group, more preferably an alkyl group or an aryl group, still more preferably an alkyl group. Each of $R^{83}$ and $R^{84}$ is preferably an alkyl group, an aryl group or a heteroaryl group, more preferably an aryl group or a heteroaryl group, still more preferably an aryl group.

In the following, the organosilicon compound (G) used in the invention is described. The organosilicon compound refers to an organic compound containing a silicon atom, and is preferably an aryl silane derivative, an alkenyl silane derivative, an alkynyl silane derivative, or a silicon-containing heterocyclic compound whose representative example is silol.

In the following, the triaryl amine derivative (H) used in the invention is described. The triaryl amine derivative refers to a compound comprising a nitrogen atom substituted by three aryl groups. The aryl groups may have substituents thereon. The substituents may be selected from the above-described substituents listed as examples of the substituent on the styryl group. The substituents may be bonded to each other to form a ring structure.

The aryl group is preferably a phenyl group, a naphthyl group, a pyrenyl group, an anthryl group, a perylenyl group or a triphenylenyl group, more preferably a phenyl group, a naphthyl group, a pyrenyl group, an anthryl group or a perylenyl group, still more preferably a phenyl group, a naphthyl group, a pyrenyl group or a perylenyl group.

The triaryl amine derivative (H) used in the invention is preferably a compound represented by the following formula (5).

Formula (5)

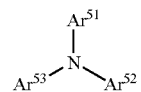

In the following, the formula (5) is explained.

$Ar^{51}$, $Ar^{52}$ and $Ar^{53}$ each independently represent an aryl group. The aryl group is preferably a phenyl group, a naphthyl group, a pyrenyl group, an anthryl group, a perylenyl group or a triphenylenyl group, more preferably a phenyl group, a naphthyl group, a pyrenyl group, an anthryl group or a perylenyl group, still more preferably a phenyl group, a naphthyl group, a pyrenyl group or a perylenyl group. At least one of $Ar^{51}$, $Ar^{52}$ and $Ar^{53}$ is preferably an aryl group including three or more cycles, more preferably an aryl group including four or more cycles.

The fluorescent compound used in the invention may be a low-molecular compound, an oligomer compound, or a polymer compound. When the fluorescent compound is a polymer, the weight-average molecular weight (polystyrene-equivalent molecular weight) is preferably in the range of 1,000 to 5,000,000, more preferably 2,000 to 1,000,000, still more preferably 3,000 to 100,000. The fluorescent compound in the invention is preferably a low-molecular compound having a weight-average molecular weight of about 300 to 1,500, and the molecular weight is preferably in the range of 400 to 1,300, particularly preferably 500 to 1,000.

Hereinafter, preferable examples of the specific fluorescent compound used in the organic electroluminescent device of the invention are shown, but the invention is not limited thereto.

(1-1)
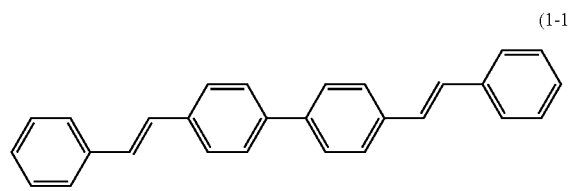
(1-2)
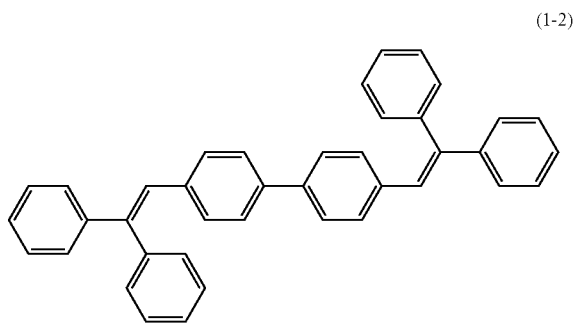
(1-3)
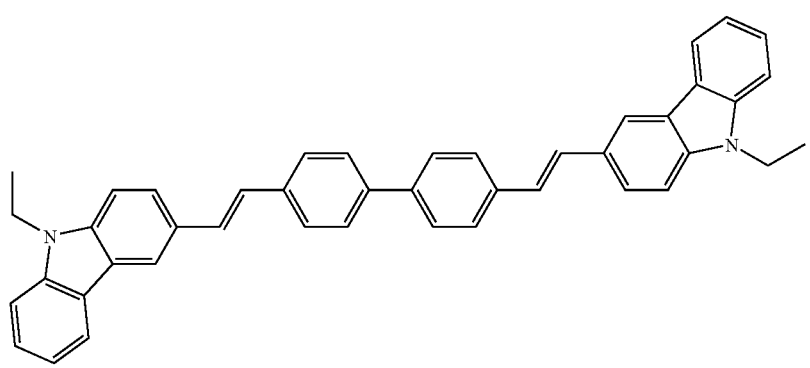
(1-4)
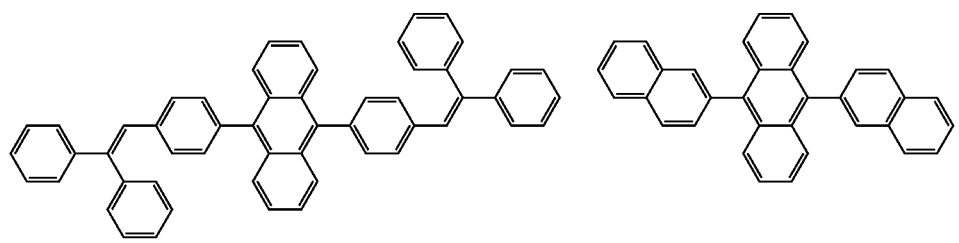
(1-5)
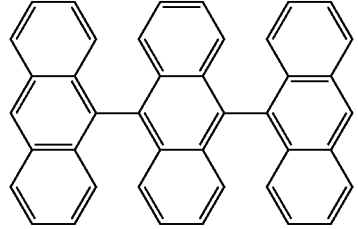
(1-6)
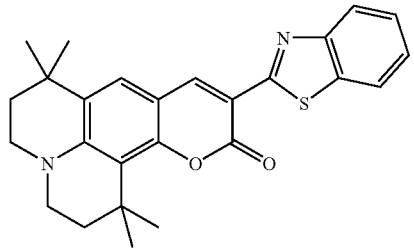
(1-7)
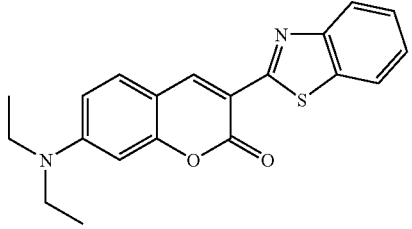
(1-8)
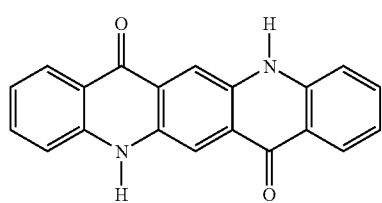
(1-9)
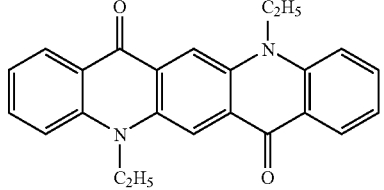
(1-10)

(1-11)
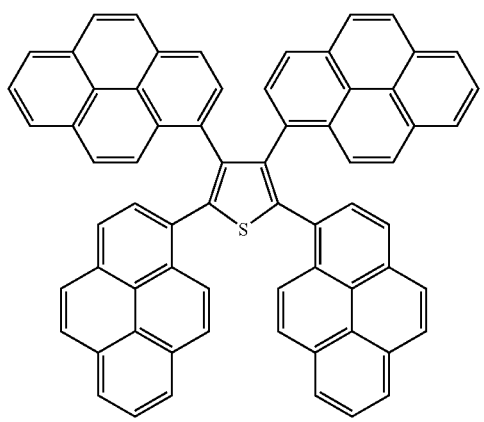
(1-12)
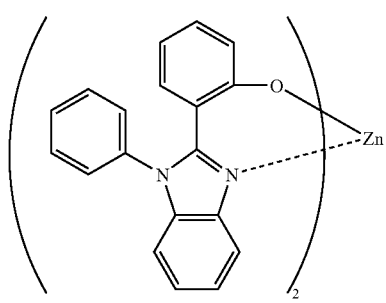
(1-13)
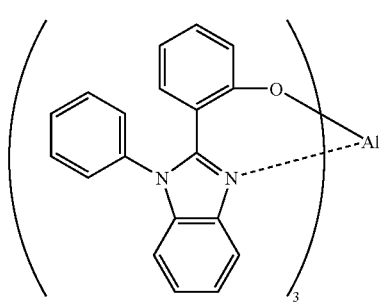
(1-14)
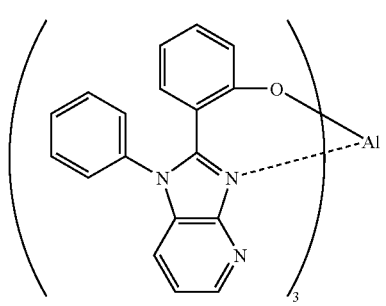
(1-15)
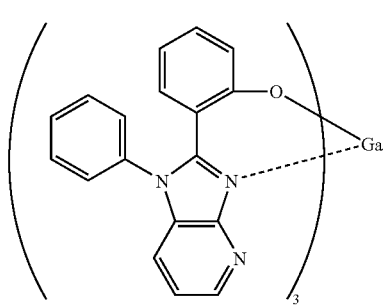
(1-16)
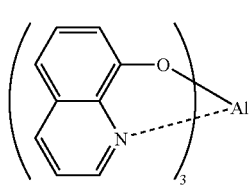
(1-17)
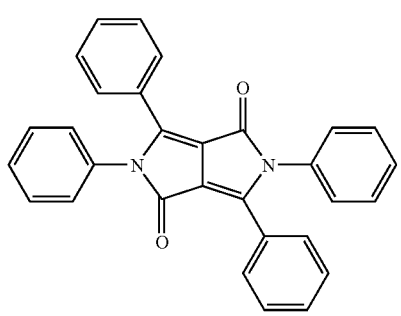
(1-18)
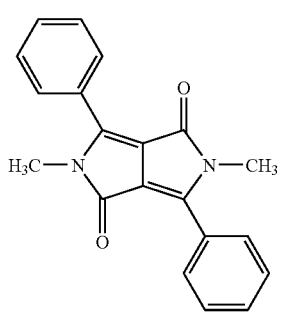
(1-19)
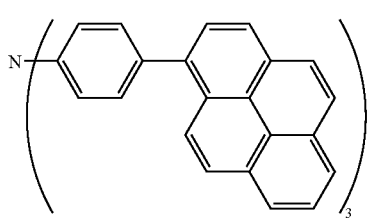
(1-20)
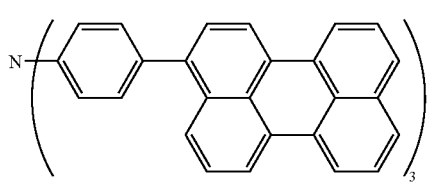

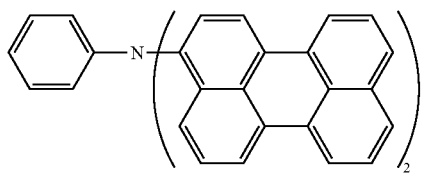 (1-21)

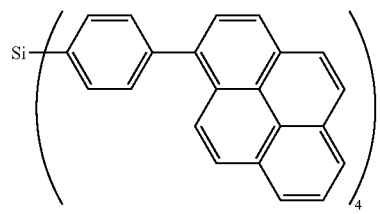 (1-22)

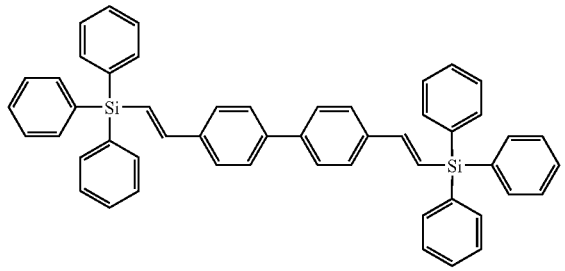 (1-23)

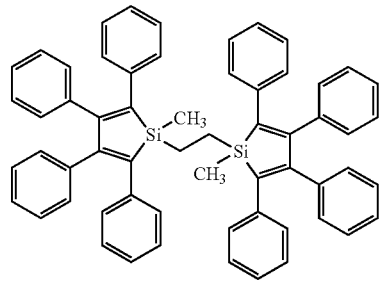 (1-24)

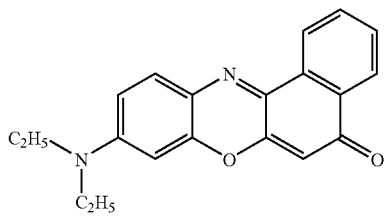 (1-25)

(1-26)

The fluorescent layer may include only a single kind of fluorescent compound or may include two or more kinds of fluorescent compounds.

When two or more fluorescent compounds are included in the luminescent layer of the luminescent device of the invention, the fluorescent compounds may have the same basic structure or may have different basic structures. At least one of the fluorescent compounds in the luminescent layer is preferably the specific fluorescent compound of the invention.

The fluorescent compounds may emit lights of different colors so that, for example, a white light may be emitted by the device.

The specific fluorescent compound is selected from the fluorescent compounds (A), (B), (C), (D), (E), (F) and (H). When two or more fluorescent compounds are included in the luminescent layer, the fluorescent compounds preferably include the specific fluorescent compound (preferably the fluorescent compound (A), (B) or (C)) and an aromatic compound having a condensed ring.

The aromatic compound having a condensed ring, which is preferably used in combination with the specific fluorescent compound, may be, for example, a compound having a condensed aromatic hydrocarbon ring (such as naphthalene, anthracene, phenanthrene, acenaphthylene, pyrene, perylene, fluoranthene, tetracene, chrysene, pentacene, coronene, or a derivative thereof (for example, tetra-t-butyl pyrene, binaphthyl, rubrene, benzopyrene, or benzoanthracene)) or a compound having a condensed aromatic heterocycle (quinoline, quinoxaline, benzimidazole, benzoxazole, benzimidazole, imidazopyridine, azaindole, or a derivative thereof (such as bisbenzoxazolyl benzene or benzoquinoline)). The aromatic compound is preferably a compound having a condensed aromatic hydrocarbon ring.

The compound having a condensed aromatic hydrocarbon ring is preferably naphthalene, anthracene, phenanthrene, acenaphthene, pyrene, perylene, fluoranthene or a derivative thereof, more preferably anthracene, fluoranthene, pyrene, perylene or a derivative thereof, still more preferably an anthracene derivative, a fluoranthene derivative, a pyrene derivative or a perylene derivative.

When the specific fluorescent compound of the invention and the condensed ring aromatic compound are contained in the luminescent layer, the ratio between the specific fluorescent compound and the condensed ring aromatic compound is preferably about 1:1.

The fluorescence quantum yield of the fluorescent compound of the invention is preferably 70% or higher, more preferably 80% or higher, still more preferably 90% or higher, further more preferably 95% or higher. As the fluorescence quantum yield, quantum yield measured at 20° C. in solid film or in solution can be used.

In the organic electroluminescent device of the invention, the content of the fluorescent compounds in the luminescent layer is not particularly limited, but is preferably 0.01 to 30 wt %, more preferably 0.1 to 10 wt %, from the viewpoint of luminous efficiency. When two or more fluorescent compounds are contained, the above preferable contents are applicable to their total amount.

The amplifying agent used in the invention refers to a compound having a function of amplifying the number of singlet excitons formed upon application of voltage thereby amplifying the luminescence intensity of the fluorescent light emitted by the fluorescent compound upon application of voltage. The amplifying agent is not particularly limited insofar as it is a compound which is capable of amplifying the number of singlet excitons formed upon application of voltage. Examples of the amplifying agent include a compound having a function of causing energy transition from triplet excitons formed in the luminescent device to singlet excitons of the fluorescent compound or of the host material. The compound having this function may be, for example, a compound emitting phosphorescent light at 20° C. (phosphorescence quantum yield is preferably 50% or higher, more preferably 70% or higher, still more preferably 90% or higher) such as a transition metal complex.

The transition metal complex is preferably an iridium complex, a platinum complex, a rhenium complex, a ruthenium complex, a palladium complex, a rhodium complex, a copper complex or a rare earth complex, still more preferably an iridium complex or a platinum complex.

The amplifying agent may be included in any layers selected from at least one organic compound layer including the luminescent layer. The luminescent layer preferably include the fluorescent compound and the amplifying agent. The concentration of the amplifying agent in these layers is not particularly limited. From the viewpoint of improving the luminous efficiency and durability of the device, the concentration is preferably 0.1 wt % to 9 wt %, more preferably 1 wt % to 8 wt %, still more preferably 2 wt % to 7 wt %, further more preferably 3 wt % to 6 wt %.

As a guide to selection of a preferable combination of the amplifying agent and the specific fluorescent compound in the luminescent device of the invention, emission spectrum and absorption spectrum of the amplifying agent and the specific fluorescent compound may be compared. In the luminescent device of the invention, it is preferable for the emission spectrum of the amplifying agent and the absorption spectrum of the fluorescent compound to have large overlapping area. In such a case, the efficiency of Foerster-type energy transfer and the efficiency of luminescent device are higher than in the case of small overlap. The emission spectrum and absorption spectrum can be measured in solution such as chloroform.

The luminescent device of the invention preferably comprises an electron transport layer, and the electron transport layer preferably comprises a non-complex compound. The non-complex compound is not particularly limited, but is preferably a nitrogen-containing heterocyclic compound.

The nitrogen-containing heterocyclic compound is not particularly limited, but is preferably a 6-membered nitrogen-containing aromatic heterocyclic compound or a 5-membered nitrogen-containing aromatic heterocyclic compound, more preferably pyridine, pyrazine, pyrimidine, triazine, quinoxaline, quinoline, pyrrole, pyrazole, imidazole, oxazole, thiazole, oxadiazole, thiadiazole, or a derivative thereof (for example, tetraphenyl pyridine, benzimidazole, or imidazopyridine), still more preferably an imidazole derivative, further more preferably an imidazopyridine derivative.

The external quantum efficiency of the luminescent device of the invention is preferably 5% or higher, more preferably 10% or higher, still more preferably 13% or higher. As the external quantum efficiency, the maximum external quantum efficiency upon driving the device at 20° C., or external quantum efficiency at around 100 to 300 cd/m$^2$ upon driving the device at 20° C., can be used.

The internal quantum efficiency of the luminescent device of the invention is preferably 30% or higher, more preferably 50% or higher, still more preferably 70% or higher. The internal quantum efficiency of the device is calculated according to the equation: internal quantum efficiency=external quantum efficiency/light extraction efficiency. In a usual organic EL device, the light extraction efficiency is about 20%, but the light extraction efficiency can be increased to 20% or higher by devising the shape of the substrate, the shape of electrodes, the thickness of the organic layers, the thickness of the inorganic layers, the refractive index of the organic layers, the refractive index of the inorganic layers, etc.

When the organic electroluminescent device of the invention has at least 3 layers including a hole transport layer, a luminescent layer and an electron transport layer, preferably, the device does not have a hole block layer or an exciton block layer between the luminescent layer and the electron transport layer. Preferably, there is only one electron transport layer between the luminescent layer and the electrode and no other layers exist between the luminescent layer and the electrode.

The hole block layer has a function of blocking holes injected through an anode, and the exciton block layer has a function of blocking excitons formed in the luminescent layer so as to limit the luminescence area. The exciton block layer corresponds to BCP described in WO 2001/008230 and in Comparative Example 1 described later.

The ionization potential of the host material contained in the luminescent layer of the invention is preferably 5.8 eV to 6.3 eV, more preferably 5.95 eV to 6.25 eV, still more preferably 6.0 eV to 6.2 eV.

The mobility of electrons in the host material in the luminescent device of the invention is preferably $1\times10^{-6}$ cm/Vs to $1\times10^{-1}$ cm/Vs, more preferably $5\times10^{-6}$ cm/Vs to $1\times10^{-2}$ cm/Vs, still more preferably $1\times10^{-5}$ cm/Vs to $1\times10^{-2}$ cm/Vs, further more preferably $5\times10^{-5}$ cm/Vs to $1\times10^{-2}$ cm/Vs.

The mobility of holes in the host material in the luminescent device of the invention is preferably $1\times10^{-6}$ cm/Vs to $1\times10^{-1}$ cm/Vs, more preferably $5\times10^{-6}$ cm/Vs to $1\times10^{-2}$ cm/Vs, still more preferably $1\times10^{-5}$ cm/Vs to $1\times10^{-2}$ cm/Vs, further more preferably $5\times10^{-5}$ cm/Vs to $1\times10^{-2}$ cm/Vs.

The glass transition point of the host material contained in the luminescent layer of the invention, the glass transition point of the electron transport layer, and the glass transition point of the hole transport material are preferably 90 to 400° C., more preferably 100 to 380° C., still more preferably 120 to 370° C., further more preferably 140 to 360° C.

The luminescent device of the invention preferably comprises a hole transport layer, a luminescent layer and an electron transport layer. In the following, layers including a fluorescent compound is ocassionally represented by "layers A1", and layers including an amplifying agent is represented by "layers B1." The luminescent layer preferably comprises a laminated construction comprising at least two layers in total of alternate layers A1 and B1, more preferably comprises a laminated construction comprising at least four layers in total of alternate layers A1 and B1, further preferably comprises a laminated construction comprising at least twelve layers in total of alternate layers A1 and B1, still further preferably comprises a laminated construction comprising at least sixteen layers in total of alternate layers A1 and B1.

In the case of a luminescent device comprising an alternate-lamination film according to the invention, the alternate-lamination film is formed preferably by a process comprising alternate repetition of: (a) vapor-depositing a fluorescent compound or a mixture including a fluorescent compound while blocking the vapor-deposition of an amplifying agent or a mixture including an amplifying agent with a shutter disposed in the vicinity of a vapor-deposition source so as to prevent the amplifying agent or the mixture including the amplifying agent from being vapor-deposited onto the device under production; and (b) vapor-depositing the amplifying agent or the mixture including the amplifying agent while blocking the vapor-deposition of the fluorescent compound or the mixture including the fluorescent compound with a shutter disposed in the vicinity of the vapor-deposition source so as to prevent the fluorescent compound or the mixture including the fluorescent compound from being vapor-deposited onto the device under production. Switching of the respective steps is conducted by opening and closing the shutters disposed in the vicinity of the vapor-deposition source. The process (a) may be conducted first or the process (b) may be conducted first. This process corresponds, for example, to the process described in Example 1.

Then, the organic electroluminescent device of the invention comprising the specific fluorescent compound is described. The luminescent device of the invention is not particularly limited with respect to the system, driving method, application mode etc. The luminescent device is typically an EL (electroluminescence) device.

The light extraction efficiency of the luminescent device of the invention can be improved by a wide variety of known techniques. The light extraction efficiency and the external quantum efficiency can be improved, for example by devising the surface of the substrate (for example by forming a patterned indented surface), by regulating the refractive indexes of the substrate, ITO layer, and organic layer, or by regulating the thicknesses of the substrate, ITO layer, organic layer.

The luminescent device of the invention may be a top-emission type device in which luminescent light is drawn from the anode side.

The base material used in the luminescent device of the invention is not particularly limited, and may be: an inorganic material such as zirconia stabilized with yttrium, or glass; a polyester such as polyethylene terephthalate, polybutylene terephthalate, or polyethylene naphthalate; or a polymer materials such as polyethylene, polycarbonate, polyether sulfone, polyarylate, allyl diglycol carbonate, polyimide, polycycloolefin, norbornene resin, poly(chlorotrifluoroethylene), TEFLON (polytetrafluoroethylene), or a polytetrafluoroethylene/polyethylene copolymer.

The organic electroluminescent device of the invention may be used in combination with a singlet blue luminescent device.

The luminescent layer in the organic electroluminescent device of the invention may comprise at least one laminated structure. The number of laminated layers is preferably 2 to 50, more preferably 4 to 30, still more preferably 6 to 20.

The thickness of each layer constituting the laminate is not particularly limited, but is preferably 0.2 nm to 20 nm, more preferably 0.4 nm to 15 nm, still more preferably 0.5 nm to 10 nm, further more preferably 1 nm to 5 nm.

The luminescent layer in the organic electroluminescent device of the invention may comprise a plurality of domain structures. The luminescent layer may comprise other domain structures having different molecular structures. The diameter of each domain is preferably 0.2 nm to 10 nm, more preferably 0.3 nm to 5 nm, still more preferably 0.5 nm to 3 nm, further more preferably 0.7 nm to 2 nm.

The method of forming the organic layer in the luminescent device containing the specific fluorescent compound according to the invention is not particularly limited. The organic layer may be formed by resistance heating deposition, by electron beam, by sputtering, by a molecular accumulation method, by a coating method (spray coating method, dip coating method, dipping method, roll coating method, gravure coating method, reverse coating method, roll brush method, air knife coating method, curtain coating method, spin coating method, flow coating method, bar coating method, micro-gravure coating method, air doctor coating, blade coating method, squeeze coating method, transfer roll coating method, kiss coating method, cast coating method, extrusion coating method, wire bar coating method, screen coating method etc.), by an ink-jet method, by a printing method, or by a transfer method, among which resistance heating deposition, a coating method and a transfer method are preferable in terms of characteristics and productivity.

The luminescent device of the invention comprises a luminescent layer or a plurality of organic compound films including a luminescent layer between two electrodes (an anode and a cathode). The luminescent device of the invention may further comprise a positive-hole injection layer, a positive-hole transport layer, an electron injection layer, an electron transport layer, or a protective layer, in addition to the luminescent layer. Each of these layers may have functions other than its primary function. Various materials can be used to form each of the layers.

The anode supplies positive holes to the positive-hole injection layer, the positive-hole transport layer, the luminescent layer, or the like. The anode material may be an alloy, a metal oxide, an electroconductive substance or a mixture thereof, preferably, a material having a work function of 4 eV or more. Specific examples of the anode material include: electroconductive metal oxides such as tin oxide, zinc oxide, indium oxide, and indium tin oxide (ITO); metals such as gold, silver, chrome, and nickel; mixtures or laminates of any of the above metals and any of the above electroconductive metal oxides; inorganic electroconductive substances such as copper iodide and copper sulfide; organic electroconductive materials such as polyaniline, polythiophene, and polypyrrole; and laminates of ITO and any of the above materials. The anode material is preferably electroconductive metal oxides, and particularly ITO is preferable in respect of productivity, high electric conductivity, transparency, or the like. The thickness of the anode can be suitably selected depending on its material, and usually the thickness is preferably in the range of 10 nm to 5 μm, more preferably 50 nm to 1 μm, still more preferably 100 nm to 500 nm.

The anode usually has a constitution in which an anode-material layer is formed on soda lime glass, non-alkali glass, a transparent resin substrate or the like. When glass is used, the glass is preferably non-alkali glass so as to reduce ions eluted from the glass. When soda lime glass is used, a barrier coat such as silica is preferably provided on the soda lime glass. The thickness of the substrate is not particularly limited insofar as it is sufficient for maintaining its mechanical strength. When glass is used, the thickness of the substrate is usually 0.2 mm or more, preferably 0.7 mm or more.

Various methods may be used to prepare the anode. For example, ITO film may be formed by an electron beam method, by a sputtering method, by a resistance heating deposition method, by a chemical reaction method (sol/gel method etc.), or by a method of applying a dispersion of indium tin oxide.

By subjecting the anode to washing or any other treatment, the driving voltage of the device can be lowered, and luminous efficiency can be increased. For example, in the case of ITO, UV-ozone treatment, plasma treatment, or the like are effective.

The cathode supplies electrons to the electron injection layer, electron transport layer, luminescent layer, or the like. The cathode material is selected in consideration of: the adhesion of the cathode to its adjacent layer such as the electron injection layer, the electron transport layer, or the luminescent layer; ionization potential of the cathode material; stability of the cathode material; and the like. As the cathode material, it is possible to use a metal, an alloy, a metal halide, a metal oxide, an electroconductive compound or a mixture thereof, and specific examples of the cathode material include alkali metals (for example, Li, Na, and K) and fluorides or oxides thereof, alkaline earth metals (for example, Mg and Ca) and fluorides or oxides thereof, gold, silver, lead, aluminum, a sodium-potassium alloy or a mixed metal of sodium and potassium, a lithium-aluminum alloy or a mixed metal of lithium and aluminum, a magnesium-silver alloy or a mixed metal of magnesium and silver, and rare earth metals such as indium, ytterbium. The cathode material is preferably a material having a work function of 4 eV or less, more preferably aluminum, a lithium-aluminum alloy or a mixed metal of lithium and aluminum, or a magnesium-silver alloy or a mixed metal of magnesium and silver. The cathode may have a single-layer structure of the above compound or mixture, or may have a laminated structure comprising compounds selected from the above compounds and mixtures. For example, a laminated structure of aluminum and lithium fluoride or a laminated structure of aluminum and lithium oxide are preferable. The thickness of the cathode can be selected suitably depending on its material, and usually the thickness of the cathode is preferably in the range of 10 nm to 5 μm, more preferably 50 nm to 1 μm, still more preferably 100 nm to 1 μm.

The cathode can be prepared by a method such as an electron beam method, a sputtering method, a resistance heating deposition method, a coating method, or a transfer method. A single metal may be vapor-deposited, or two or more components may be simultaneously vapor-deposited. Further, a plurality of metals can be simultaneously vapor-deposited to form an alloy electrode, or a previously prepared alloy may be vapor-deposited.

A lower sheet resistance of the anode or cathode is more preferred. The sheet resistance of the anode or cathode is preferably several hundreds Ω/□ or lower. The sheet resistance is preferably 500 Ω/□ or lower, more preferably, 300 Ω/□ or lower, particularly preferably, 200 Ω/□ or lower.

The luminescent layer is capable of accepting positive holes from the anode, or from the positive-hole injection layer, or from the positive-hole transport layer, and is also capable of accepting electrons from the cathode, or from the electron injection layer, or from the electron transport layer. The luminescent layer is further capable of transporting injected charges, and also capable of providing a site for recombination of positive holes and electrons so as to emit light. The substances included in the luminescent layer are not particularly limited so long as the substances form a layer which satisfy the above requirements for the luminescent layer. Examples of the substances include not only the compounds of the invention but also various metal complexes (such as metal complexes and rare earth complexes of benzoxazole, benzimidazole, benzothiazole, styryl benzene, polyphenyl, diphenyl butadiene, tetraphenyl butadiene, naphthalimide, coumarin, perylene, perinone, oxadiazole, aldazine, pyralizine, cyclopentadiene, bis-styryl anthracene, quinacridone, pyrrolopyridine, thiadiazolopyridine, cyclopentadiene, styryl amine, aromatic dimethylidene compounds and 8-quinolinol), polymer compounds (such as polythiophene, polyphenylene, and polyphenylene vinylene), organic silane, iridium trisphenyl pyridine complex, and transition metal complexes such as platinum porphyrin complex, and derivatives thereof. The thickness of the luminescent layer is not particularly limited, and usually the thickness is preferably in the range of 1 nm to 5 μm, more preferably 5 nm to 1 μm, still more preferably 10 nm to 500 nm.

The method of forming the luminescent layer is not particularly limited, and methods such as resistance heating deposition, electron beam, sputtering, a molecular accumulation method, a coating method, an ink-jet method, a printing method, an LB method, a transfer method, and the like may be used, among which resistance heating deposition and a coating method are preferable.

The luminescent layer may be formed from a single substance or a plurality of substances. There may be only one luminescent layer or may be a plurality of luminescent layers, and such luminescent layers may emit lights with respectively different colors (for example, white light may be emitted based on the combination of the respective lights). In an embodiment, white light is emitted from a single luminescent layer. When there are a plurality of luminescent layers, the luminescent layers each may be formed from a single substance or a plurality of substances.

The main components of the positive-hole injection layer or positive-hole transport layer are not limited insofar as: the positive-hole injection layer has a function of being injected with positive holes; and the positive-hole transport layer has a function of transporting positive holes. The positive-hole injection layer and positive-hole transport layer each may optionally have a function of blocking electrons migrating from the cathode. Specific examples of the main components include: electroconductive high-molecular oligomers of carbazole, triazole, oxazole, oxadiazole, imidazole, polyaryl alkane, pyrazoline, pyrazolone, phenylene diamine, aryl amine, amino-substituted chalcone, styryl anthracene, fluorenone, hydrazone, stilbene, silazane, aromatic tertiary amine compounds, styryl amine compounds, aromatic dimethylidene compounds, porphyrin compounds, polysilane compounds, poly(N-vinyl carbazole), aniline copolymers, thiophene oligomers, polythiophene, and the like; organic silane; carbon films; the compounds of the invention; and derivatives thereof. The thickness of the positive-hole injection layer or positive-hole transport layer is not particularly limited, and usually the thickness is preferably in the range of 1 nm to 5 μm, more preferably 5 nm to 1 μm, still more preferably 10 nm to 500 nm. There may be a single positive-hole injection layer comprising at least one of the above substances, or there may be provided two or more positive-hole injection layers each having the same or different composition. Similarly, there may be a single positive-hole transport layer comprising at least one of the above substances, or there may be provided two or more positive-hole transport layers each having the same or different composition.

The method of forming the positive-hole injection layer or the positive-hole transport layer may be a vacuum deposition method, an LB method, a method of applying a solution or dispersion of the positive-hole injection transfer substance in a solvent, an ink-jet method, a printing method, and a transfer method. In the coating method, the substances can be dissolved or dispersed together with a resin component, and examples of the resin component include polyvinyl chloride, polycarbonate, polystyrene, polymethyl methacrylate, polybutyl methacrylate, polyester, polysulfone, polyphenylene oxide, polybutadiene, poly(N-vinyl carbazole), hydrocarbon resin, ketone resin, phenoxy resin, polyamide, ethyl cellulose, vinyl acetate, ABS resin, polyurethane, melamine resin, unsaturated polyester resin, alkyd resin, epoxy resin, and silicon resin.

The main components of the electron injection layer or electron transport layer is not limited insofar as: the electron injection layer has a function of being injected with electrons; and the electron transport layer has a function of transporting electrons. The electron injection layer and electron transport layer each may have a function of blocking positive holes migrating from the anode. Specific examples of the main components include: various metal complexes such as metal complexes of triazole, oxazole, oxadiazole, imidazole, fluorenone, anthraquinodimethane, anthrone, diphenyl quinone, thiopyran dioxide, carbodiimide, fluorenylidene methane, distyryl pyrazine, aromatic tetracarboxylic acid anhydrides (such as naphthalene tetracarboxylic acid anhydride and perylene tetracarboxylic acid anhydride), phthalocyanine and 8-quinolinol, and metal complexes comprising ligands selected from metal phthalocyanine, benzoxazole, and benzothiazole; organic silane; and derivatives thereof. The thickness of the electron injection layer or electron transport layer is not particularly limited, but usually the thickness is preferably in the range of 1 nm to 5 μm, more preferably 5 nm to 1 μm, still more preferably 10 nm to 500 nm. There may be a single electron injection layer comprising at least one of the above substances, or there may be provided two or more electron injection layers each having the same or different composition. Similarly, there may be a single electron transport layer comprising at least one of the above substances, or there may be provided two or more electron transport layers each having the same or different composition.

The method of forming the electron injection layer or the electron transport layer may be a vacuum deposition method, an LB method, a method of applying a solution or dispersion of the electron injection transfer materials in a solvent, an ink-jet method, a printing method, and a transfer method. In the coating method, the materials can be dissolved or dispersed together with a resin component, and the resin component may be selected from the resin components listed as examples in the explanation of positive-hole injection layer and positive-hole transfer layer.

The material of the protective layer is not limited insofar as it has a function of preventing substances (such as water and oxygen) which cause deterioration of the device from entering the device. Specific examples of the protective layer material include metals such as In, Sn, Pb, Au, Cu, Ag, Al, Ti, and Ni, metal oxides such as MgO, SiO, $SiO_2$, $Al_2O_3$, GeO, NiO, CaO, BaO, $Fe_2O_3$, $Y_2O_3$, and $TiO_2$, metal fluorides such as $MgF_2$, LiF, $AlF_3$, and $CaF_2$, nitrides such as $SiN_x$ and $SiO_xN_y$, polyethylene, polypropylene, polymethyl methacrylate, polyimide, polyurea, polytetrafluoroethylene, polychlorotrifluoroethylene, polydichlorodifluoroethylene, a chlorotrifluoroethylene/dichlorodifluoroethylene copolymer, a copolymer obtained by copolymerizing a monomer mixture containing tetrafluoroethylene and at least one kind of comonomer, a fluorine-containing copolymer having a cyclic structure on a main chain of the copolymer, a water-absorbing substance having a water absorption of 1% or higher, and a dampproof substance having a water absorption of 0.1% or lower.

The method of forming the protective layer is not particularly limited. Examples of usable methods include a vacuum deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas source CVD method, a coating method, a printing method, and a transfer method.

Applications of the luminescent device of the invention are not particularly limited. The luminescent device of the invention can be used preferably in the fields of display devices, displays, backlight, electrophotography, lighting, recording light sources, exposure light sources, reading light sources, labels, signboards, interiors, optical communication, and the like.

EXAMPLES

Hereinafter, the present invention is described by reference to the Examples, but embodiments of the invention are not limited thereto. In the Examples, the term "Exemplary Compound" refers to one of the compounds shown above as examples of the specific fluorescent compound of the invention.

Example 1

A washed ITO substrate was placed in a vapor-deposition apparatus, and TPD (N,N'-diphenyl-N,N'-di(m-natholyl)-benzidine) was vapor-deposited thereon to a thickness of 60 nm. CBP (whose structure is shown below) and the Exemplary Compound (1-8), which is a specific fluorescent compound, were vapor-deposited thereon to a thickness of 1 nm in a ratio of 99:1 (ratio by weight). Then, CBP and Ir(ppy)$_3$ (whose structure is shown below) were vapor-deposited thereon to a thickness of 1 nm in a ratio of 90:10. The above two processes of vapor-depositing 1 nm films were alternately repeated 5 times to form an alternately laminated film consisting of 10 films having a thickness of 10 nm in total. BCP (whose structure is shown below) was vapor-deposited to a thickness of 20 nm thereon, and Alq (whose structure is shown below) was vapor-deposited to a thickness of 30 nm thereon. A patterning mask (such a mask as to give a luminescent area of 4 mm×5 mm) was arranged on this organic film, and magnesium and silver were vapor-deposited to a thickness of 100 nm in a ratio of 25:1 in the vapor-deposition apparatus, and silver was vapor-deposited to a thickness of 50 nm thereon to give an EL device of Example 1.

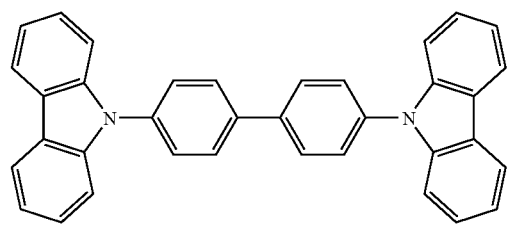

CBP

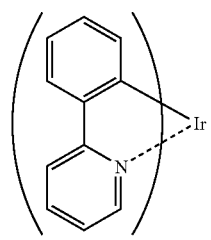

Ir(ppy)$_3$

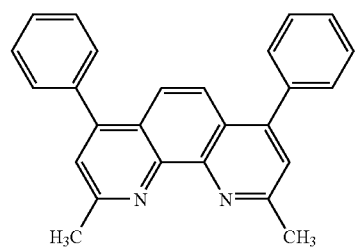

BCP

-continued

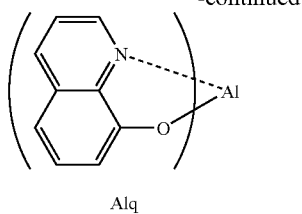

Alq

2. Evaluation of the Luminescent Device

Using a source measure unit 2400 manufactured by Toyo Corporation, DC constant voltage was applied to the EL device of Example 1 thereby permitting it to emit light, and its luminance was measured by a luminance meter BM-8 manufactured by Topcon Corporation.

As a result, green emission with the luminance maximum of about 10000 cd/m$^2$ was observed. When the durability at emission at 1000 cd/m$^2$ was evaluated, the half-life period was about 4 times as long as that of a device of Comparative Example 1 below.

Comparative Example 1

Preparation of the Luminescent Device Described in

The EL device of Comparative Example 1 was obtained in the same manner as in Example 1 except that DCM2 (whose structure is shown below) was used in place of the Exemplary Compound (1-8) used in Example 1. When the luminance maximum was measured in the same manner as in Example 1, red emission was observed, but the luminance maximum was about 5000 cd/m$^2$.

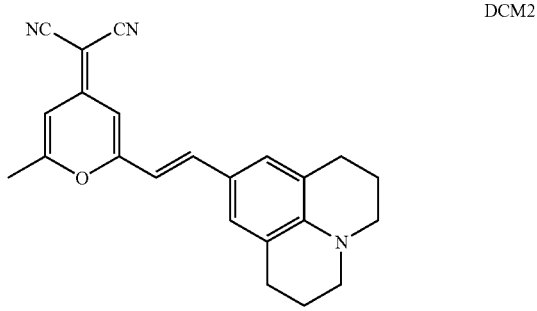

DCM2

Example 2

An EL device was obtained and evaluated in the same manner as in Example 1 except that the Exemplary Compound (1-25) was used in place of the Exemplary Compound (1-8) used in Example 1.

As a result, red emission with the luminance maximum of about 6000 cd/m$^2$ was obtained. When the durability at emission at 1000 cd/m$^2$ was evaluated, the half-life period was about 2 times as long as that of the device of Comparative Example 1.

Example 3

An EL device was obtained and evaluated in the same manner as in Example 1 except that Compound A shown below was vapor-deposited to a thickness of 50 nm in place of the laminated structure of BCP and Alq in Example 1. As a result, green emission with the luminance maximum of about 15000 cd/m$^2$ was observed. When the durability at emission at 1000 cd/m$^2$ was evaluated, the half-life period was about 3 times as long as that of the device of Comparative Example 1.

Compound A

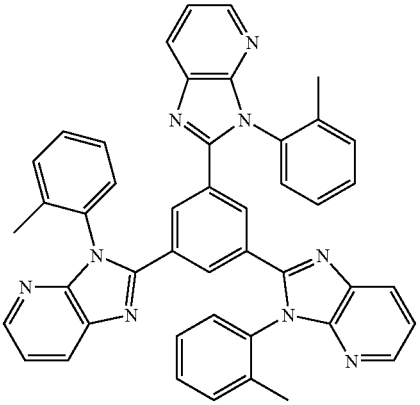

Example 4

An EL device was obtained and evaluated in the same manner as in Example 1 except that the Exemplary Compound (1-26) was used in place of the Exemplary Compound (1-8) used in Example 1.

As a result, greenish yellow emission with the luminance maximum of about 7000 cd/m$^2$ was obtained. When the durability at emission at 1000 cd/m$^2$ was evaluated, the half-life period was about 4 times as long as that of the device of Comparative Example 1.

Example 5

A washed ITO substrate was placed in a vapor-deposition apparatus, and TPD (N,N'-diphenyl-N,N'-di(m-natholyl)-benzidine) was vapor-deposited to a thickness of 60 nm thereon. CBP and DCJTB (whose structure is shown below) were vapor-deposited thereon to a thickness of 1 nm in a ratio of 99:1 (ratio by weight), and CBP and Ir(ppy)$_3$ were vapor-deposited thereon to a thickness of 1 nm in a ratio of 90:10. The above two vapor-deposition processes of forming 1 nm films were repeated 5 times to form an alternately laminated film consisting of 10 films having a thickness of 10 nm in total. The Exemplary Compounds (1-2) and (1-3) were vapor-deposited thereon to a thickness of 5 nm in a ratio of 95:5 (ratio by weight), and BCP was vapor-deposited to a thickness of 20 nm thereon. Then, a patterned mask (such a mask as to give a luminescent area of 4 mm×5 mm) was arranged on this organic film, and magnesium and silver were vapor-deposited to a thickness of 100 nm in a ratio of 25:1 in the vapor-deposition apparatus, and silver was vapor-deposited to a thickness of 50 nm thereon to give an EL device of Example 5. This EL device emitted white light. When the durability at emission at 1000 cd/m$^2$ was evaluated, the half-life period was about twice as long as that of the device of Comparative Example 1.

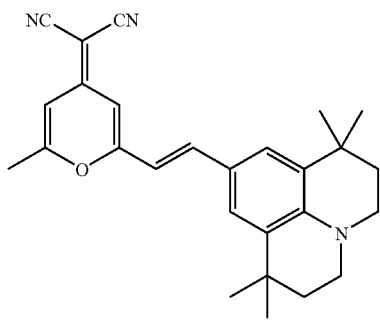

DCJTB

Even when other specific compounds of the invention are used as the fluorescent compound, the resulting EL device can bring about the same effect.

The luminescent device of the invention can be used preferably in the fields of display devices, displays, backlights, electrophotography, lighting, recording light sources, exposure light sources, reading light sources, labels, signboards, interiors, optical communication and the like.

According to the invention, there is provided an organic electroluminescent device excellent in luminous efficiency and capable of emission with high luminance.

What is claimed is:

1. An organic electroluminescent device comprising two electrodes and at least one organic compound layer disposed between the electrodes,
    wherein a luminescent layer comprising a laminated construction comprising at least two alternating layers in total where one layer includes a fluorescent compound and the other layer includes an amplifying agent, is included in the organic compound layers, at least one of the organic compound layers comprises the amplifying agent, the fluorescent compound emits fluorescent light upon application of voltage, the amplifying agent is capable of amplifying a number of singlet excitons formed upon the application of voltage and of amplifying luminescence intensity upon the application of voltage, and an amount of the amplifying agent is such an amount that at least 51% of light components emitted by the device upon the application of voltage is fluorescent light,
    wherein the fluorescent compound is a compound represented by the following formula (7):

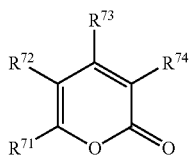

Formula (7)

wherein in Formula (7), $R^{71}$ and $R^{72}$ bond to one another to form a benzene ring resulting a coumarin skeleton that is further substituted with a dialkylamino group at the 7-position of the coumarin skeleton, $R^{73}$ represents a hydrogen atom, and $R^{74}$ represents a five membered heterocyclic ring as follows:

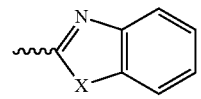

wherein X is S;
wherein a host material is contained in both the layer including the fluorescent compound and the layer including the amplifying agent, and
wherein the laminated construction comprises at least four alternating layers.

2. The organic electroluminescent device according to claim 1, wherein a concentration of the fluorescent compound in the luminescent layer is 0.1% to 10% by weight.

3. The organic electroluminescent device according to claim 1, wherein a fluorescence quantum yield of the fluorescent compound is 70% or higher.

4. The organic electroluminescent device according to claim 1, wherein an emission spectrum of the amplifying agent overlaps an absorption spectrum of the fluorescent compound.

5. The organic electroluminescent device according to claim 1, wherein a phosphorescence quantum yield of the amplifying agent is 50% or higher.

6. The organic electroluminescent device according to claim 1, wherein a phosphorescence life of the amplifying agent is 10 μs or shorter.

7. The organic electroluminescent device according to claim 1, wherein one of the organic compound layers contacts an anode-side surface of the luminescent layer and the organic compound layer has a lowest excited triplet state energy of 209.2 kJ/mol to 377.1 kJ/mol.

8. The organic electroluminescent device according to claim 1, wherein one of the organic compound layers contacts a cathode-side surface of the luminescent layer and the organic compound layer has a lowest excited triplet state energy of 209.2 kJ/mol to 377.1 kJ/mol.

9. The organic electroluminescent device according to claim 1, wherein the device emits white light.

10. The organic electroluminescent device according to claim 1, wherein the number of laminated layers in the laminated construction is 6 to 20.

11. The organic electroluminescent device according to claim 1, wherein the thickness of each of the at least four alternating layers is from 0.5 nm to 10 nm.

12. The organic electroluminescent device according to claim 1, wherein the thickness of each of the at least four alternating layers is from 1 nm to 5 nm.

13. The organic electroluminescent device according to claim 1, wherein the organic electroluminescent device is used in combination with a singlet blue luminescent device.

* * * * *